United States Patent
Kothandapani

(10) Patent No.: US 12,020,999 B2
(45) Date of Patent: Jun. 25, 2024

(54) COVER LID WITH SELECTIVE AND EDGE METALLIZATION AND METHODS OF MAKING

(71) Applicant: MATERION CORPORATION, Mayfield Heights, OH (US)

(72) Inventor: Ramesh Kothandapani, Singapore (SG)

(73) Assignee: Materion Corporation, Mayfield Heights, OH (US)

( * ) Notice: Subject to any disclaimer, the term of this patent is extended or adjusted under 35 U.S.C. 154(b) by 145 days.

(21) Appl. No.: 17/308,461

(22) Filed: May 5, 2021

(65) Prior Publication Data

US 2021/0257270 A1 Aug. 19, 2021

Related U.S. Application Data

(62) Division of application No. 15/504,505, filed as application No. PCT/US2015/031877 on May 21, 2015, now Pat. No. 11,031,309.

(Continued)

(51) Int. Cl.
*H01L 23/10* (2006.01)
*B23K 1/00* (2006.01)
(Continued)

(52) U.S. Cl.
CPC .............. *H01L 23/10* (2013.01); *B23K 1/00* (2013.01); *B32B 3/06* (2013.01); *B32B 3/266* (2013.01); *B32B 9/005* (2013.01); *B32B 9/041* (2013.01); *C04B 37/026* (2013.01); *B32B 2255/205* (2013.01); *B32B 2439/00* (2013.01); *B32B 2457/14* (2013.01); *C04B 2237/125* (2013.01); *C04B 2237/34* (2013.01); *C04B 2237/343* (2013.01); *C04B 2237/348* (2013.01); *C04B 2237/365* (2013.01); *C04B 2237/366* (2013.01); *C04B 2237/368* (2013.01);
(Continued)

(58) Field of Classification Search
CPC ...................................................... H01L 23/10
See application file for complete search history.

(56) References Cited

U.S. PATENT DOCUMENTS

| | | |
|---|---|---|
| 4,038,157 A | 7/1977 | Kim et al. |
| 4,331,258 A | 5/1982 | Geschwind |

(Continued)

FOREIGN PATENT DOCUMENTS

| | | | |
|---|---|---|---|
| JP | 5558614 B1 | * | 7/2014 |
| TW | 201135891 A | | 10/2011 |
| TW | 201313964 A | | 4/2013 |

OTHER PUBLICATIONS

English Translation of JP5558614B1 obtained from Google Patents on Feb. 13, 2023 (Year: 2023).*

(Continued)

*Primary Examiner* — Adam Krupicka
(74) *Attorney, Agent, or Firm* — COZEN O'CONNOR

(57) ABSTRACT

A cover lid for use with a semiconductor package is disclosed. First, a polyamide mask is applied to one surface of the lid plate. Next, the exposed areas of the surface, as well as the sides of the lid plate, are metallized. The polyamide mask can then be removed. This reduces pullback and shrinkage of the metallized layer, while lowering the manufacturing cost and process times.

16 Claims, 6 Drawing Sheets

Related U.S. Application Data

(60) Provisional application No. 62/058,351, filed on Oct. 1, 2014.

(51) Int. Cl.
 *B32B 3/06* (2006.01)
 *B32B 3/26* (2006.01)
 *B32B 9/00* (2006.01)
 *B32B 9/04* (2006.01)
 *C04B 37/02* (2006.01)

(52) U.S. Cl.
 CPC .. *C04B 2237/408* (2013.01); *C04B 2237/592* (2013.01); *C04B 2237/708* (2013.01); *C04B 2237/86* (2013.01); *H01L 2924/16195* (2013.01)

(56) References Cited

U.S. PATENT DOCUMENTS

| | | |
|---|---|---|
| 4,746,583 A | 5/1988 | Falanga |
| 4,833,102 A | 5/1989 | Byrne et al. |
| 5,414,300 A | 5/1995 | Tozawa et al. |
| 5,572,065 A | 11/1996 | Burns |
| 5,742,007 A | 4/1998 | Kornowski et al. |
| 5,783,464 A | 7/1998 | Burns |
| 5,825,086 A | 10/1998 | Kimura et al. |
| 6,095,397 A | 8/2000 | Wolf et al. |
| 10,211,115 B2 | 2/2019 | Kothandapani |
| 2002/0090761 A1 | 7/2002 | Goldmann et al. |
| 2004/0104460 A1 | 6/2004 | Stark |
| 2004/0183172 A1 | 9/2004 | Saito et al. |
| 2011/0169158 A1 | 7/2011 | Varanasi |
| 2013/0049555 A1 | 2/2013 | Ramesh et al. |
| 2014/0264949 A1 | 9/2014 | Kothandapani |
| 2015/0340298 A1 | 11/2015 | Kothandapani |
| 2017/0229361 A1 | 8/2017 | Kothandapani |

OTHER PUBLICATIONS

Extended European Search Report for EP Application No. 15846230.9 dated Feb. 27, 2018.
International Search Report for PCT Patent Application PCT/US2015/031877 dated Aug. 14, 2015.

\* cited by examiner

COVER LID WITH SELECTIVE AND EDGE METALLIZATION AND METHODS OF MAKING

CROSS-REFERENCE TO RELATED APPLICATIONS

This application is a division of U.S. application Ser. No. 15/504,505, filed Feb. 16, 2017, which is a 371 of PCT Application Serial No. PCT/US2015/031877, filed May 21, 2015, which claims priority to U.S. Provisional Patent Application Ser. No. 62/058,351, filed Oct. 1, 2014, the entirety of which is fully incorporated by reference herein.

BACKGROUND

The present disclosure relates to cover lids used for hermetic sealing of electronic packages. More specifically, processes for making such cover lids with reduced defects are described herein, as are the cover lids formed thereby and electronic packages including such cover lids.

Hermetically sealed electronic packages can be made by placing a cover lid over an electronic component mounted within a cavity of an insulating package base. Peripheral areas of the cover lid and the package base are then joined by using a sealant to hermetically seal the cavity. The sealant is typically a soft solder for soldering. Soft solder has a relatively low melting temperature, so sealing can be performed at a low temperature.

When the cover lid is made of a non-metallic material, the cover lid must be metallized to form a metal layer on the peripheral sealing area to enable the cover lid to be bonded by soldering. This adds to the production costs of the cover lid.

Some issues can arise with the metallized layer on the cover lid. First, the mask used to metallize the peripheral area can be offset (i.e. incorrectly registered), resulting in different widths of the metallized portion around the periphery of the cover lid and potentially weakening the hermetic seal on the portion that is now thinner than intended. Second, the metallized layer can pull back from the edges of the lid, creating gaps and again potentially weakening the hermetic seal. Outgassing can also occur due to organic content in the metallized layer. These can result in leak failures, delamination, poor bonding, etc. In addition, issues can arise with the solder, such as solder voids, dewetting, splatters, and PIND failures (when excess solder forms particles inside the cavity).

It would be desirable to provide methods that minimize these problems.

BRIEF DESCRIPTION

The present disclosure relates to methods of making cover lids for use in hermetic sealing of electronic packages. The cover lid is formed from a plate. A polyamide mask is applied to a surface of the plate, thus defining a central area covered by the mask and a peripheral area not covered by the mask. The peripheral area and the sidewall of the plate are metallized to form a seal ring, and the polyamide mask is removed. As desired, the seal ring can be formed from additional metal sublayers. A solder preform can then be attached to the seal ring, for example by tack welding.

Disclosed herein are various methods of making a cover lid, comprising: applying a polyamide mask to a central area of a first surface of a plate and define a peripheral area on the first surface, wherein the plate has a first surface, a second surface, and a sidewall joining the first surface and second surface together; forming a seal ring by metallizing the peripheral area and the sidewall of the plate; and removing the polyamide mask to obtain the cover lid.

The plate can be made from beryllium-copper, molybdenum, bronze, glass, an iron-nickel-cobalt alloy, or a ceramic selected from the group consisting of alumina ($Al_2O_3$), beryllia (BeO), aluminum nitride (AlN), zirconia toughened alumina (ZTA), SiC, and $Si_3N_4$. The plate may have a thickness of about 0.5 millimeter to about 1 millimeter. In some particular embodiments, the plate is formed from a non-magnetic material.

The peripheral area which is metallized may be from about 20% to about 35% of the surface area of the first surface of the plate.

In some embodiments, the seal ring is formed from a metal selected from the group consisting of silver, palladium, platinum, nickel, gold, and alloys thereof. Sometimes, the seal ring can be formed from a set of sublayers. In other embodiments, the seal ring can be formed from a non-magnetic metal.

The seal ring on the peripheral area may have a width of about 0.5 mm to about 1 mm. The seal ring on the peripheral area can have a thickness of about 1 micrometer ($\mu m$) to about 40 $\mu m$.

The plate can be in the shape of a disk or a rectangular prism. The sidewall may have a plurality of faces.

The methods may further comprise tack welding a solder preform to the seal ring on the peripheral area. The solder preform can have a melting temperature of from about 200° C. to about 350° C. The solder preform may be formed from a gold-tin alloy, a lead-based alloy, or a lead-free alloy.

Also disclosed herein are cover lids, comprising: a plate comprising a first surface, a second surface, and a sidewall joining the first surface and second surface together; a seal ring on a peripheral area of the first surface and the sidewall of the plate; and a solder preform connected to the seal ring on the peripheral area.

The plate can be made from beryllium-copper, molybdenum, bronze, glass, an iron-nickel-cobalt alloy, or a ceramic selected from the group consisting of alumina ($Al_2O_3$), beryllia (BeO), aluminum nitride (AlN), zirconia toughened alumina (ZTA), SiC, and $Si_3N_4$.

The seal ring can be formed from a metal selected from the group consisting of silver, palladium, platinum, nickel, gold, and alloys thereof. Sometimes, the seal ring is formed from a set of sublayers. The solder preform may also be formed from a gold-tin alloy, a lead-based alloy, or a lead-free alloy.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
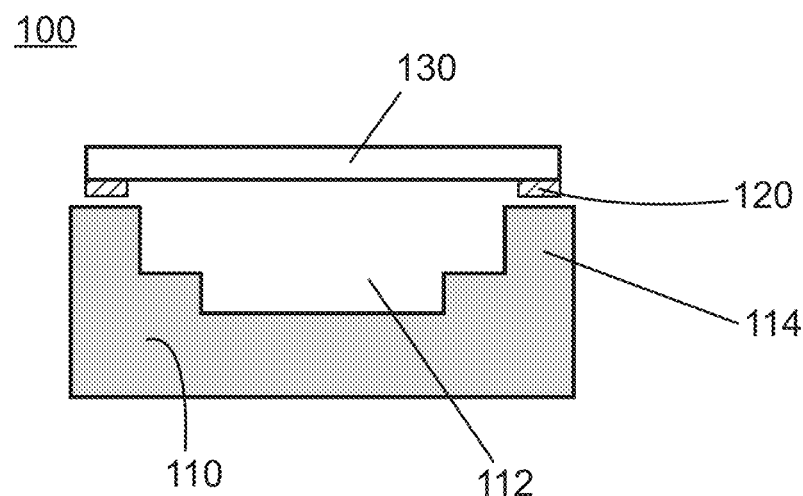
FIG. 1 is a side cross-sectional view of a conventional electronic package.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named components/steps and permit the presence of other components/steps. However, such description should be construed as also describing compositions or processes as "consisting of" and "consisting essentially of" the enumerated components/steps, which allows the presence of only the named components/steps, along with any impurities that might result therefrom, and excludes other components/steps.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 to 10" is inclusive of the endpoints, 2 and 10, and all the intermediate values).

A value modified by a term or terms, such as "about" and "substantially," may not be limited to the precise value specified. The modifier "about" should also be considered as disclosing the range defined by the absolute values of the two endpoints. For example, the expression "from about 2 to about 4" also discloses the range "from 2 to 4."

Figure 2:
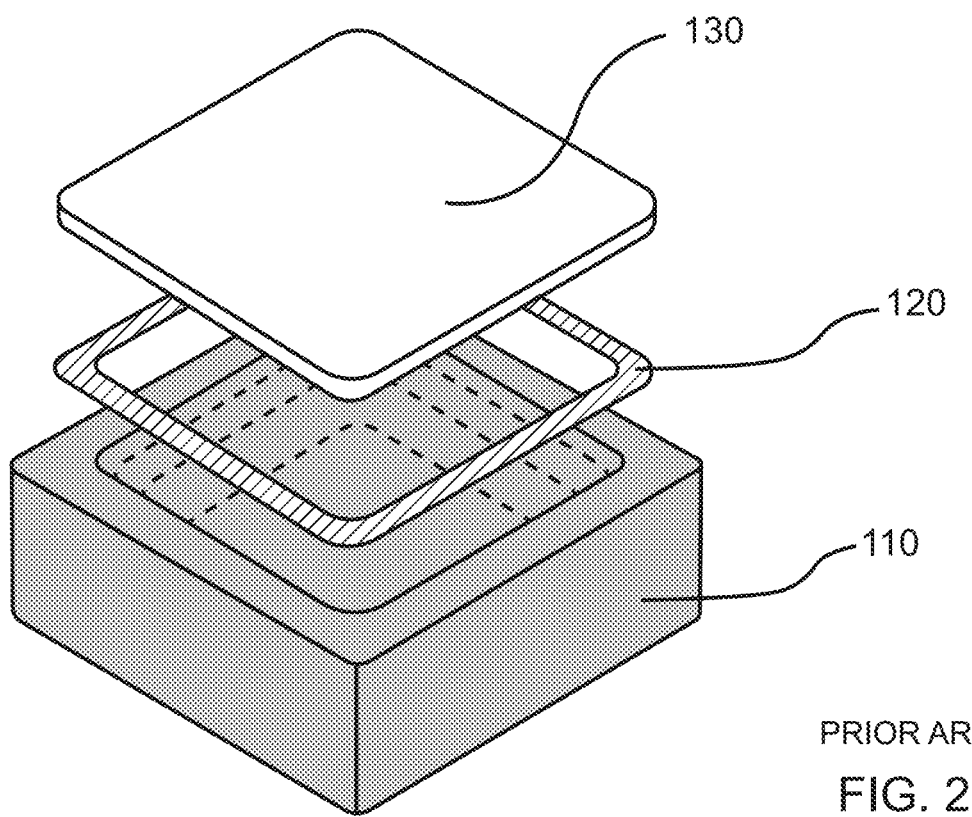
FIG. 2 is an exploded perspective view of a conventional electronic package.

Initially, a hermetically sealable electronic package is illustrated in FIG. 1 and FIG. 2. FIG. 1 is a side cross-sectional view of the package, and FIG. 2 is an exploded perspective view showing various aspects of the package.

The electronic package 100 is formed from an insulating base 110, a solder preform 120, and a lid 130. The base is shaped to include a cavity 112 in which an electronic component (e.g. a semiconductor) is mounted. Not shown here are various leads and vias which may be included with the base. The periphery of the base includes a raised wall 114. When heated, the solder preform melts and fuses the lid to the raised wall of the base.

Figure 3:
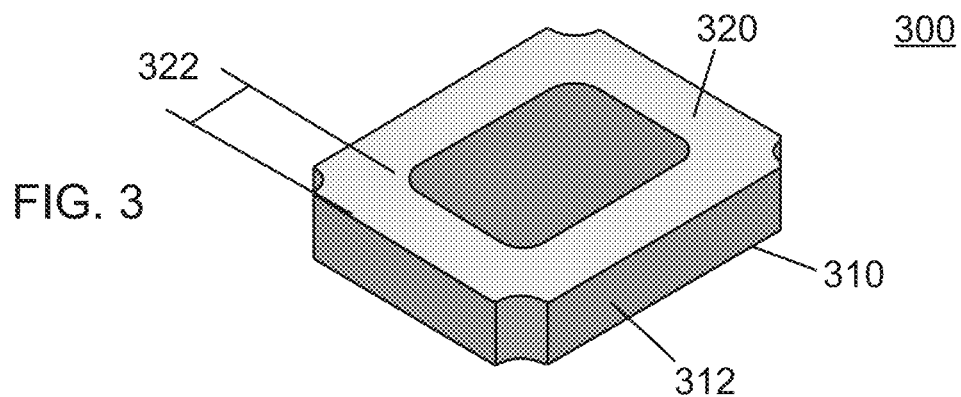
FIG. 3 is a perspective view of an "ideal" cover lid having a plate with a metallized seal ring thereon.

FIG. 3 is a perspective view of a cover lid 300 to be used in hermetically sealing an electronic package. The cover lid includes a plate 310 and a metallized seal ring 320 which is used to permit soldering of the cover lid. FIG. 3 shows an idealized application of the metallized seal ring. Here, the width 322 of the seal ring is constant around the periphery of the plate. It is noted that the seal ring is only present on the first surface of the plate, and does not cover the sidewall 312 of the plate.

Figure 4:
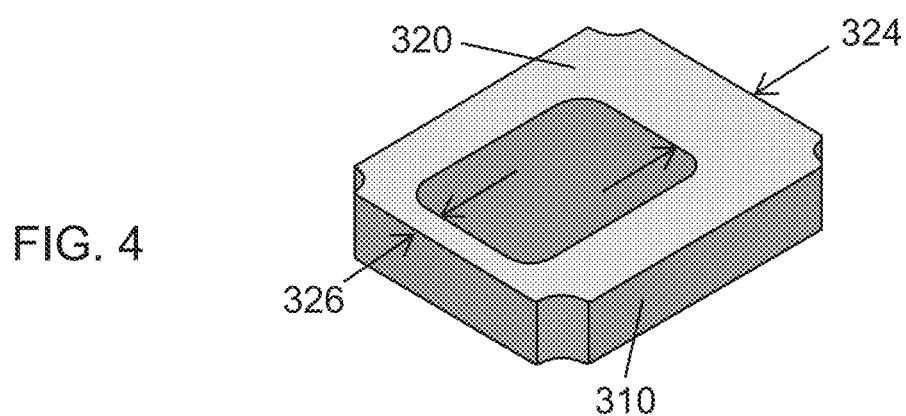
FIG. 4 is a perspective view of a cover lid in which the seal ring is undesirably offset.

In FIG. 4, an undesirable offset seal ring is shown. As seen here, the width 324 of the seal ring on the top right side is larger than desired, and the width 326 of the seal ring on the bottom left side is smaller than desired.

Figure 5:
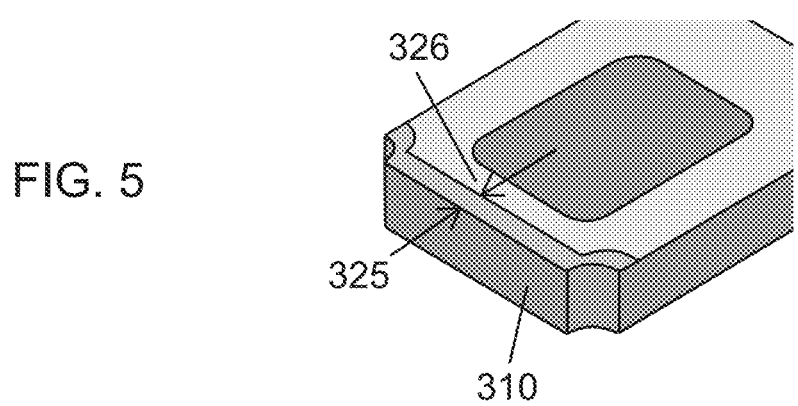
FIG. 5 is a perspective view of a cover lid in which the seal ring has undesirably pulled back from an edge of the plate.

In FIG. 5, pullback of the metallized seal ring is illustrated. Here, a portion 326 of the metallized seal ring is no longer contiguous with the edge 325 of the plate.

The present disclosure provides methods of making a cover lid that reduces these events from occurring. Briefly, a polyamide mask is used to cover the central area of the surface of a plate. A seal ring is then formed by metallizing the peripheral area of the surface and the sidewall of the plate as well to form one continuous layer. This improves yield, seal strength, and also provides visual assurance to end users. A solder preform is then tack welded to the seal ring.

Figure 6:
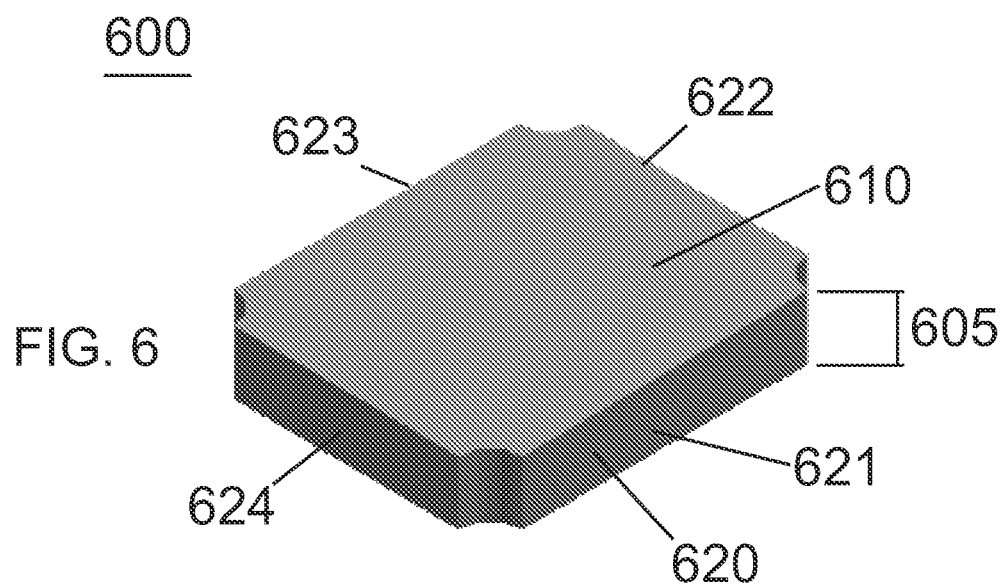
FIG. 6 is a perspective view of a plate from which a cover lid will be made.

Initially, FIG. 6 is a perspective view of the plate from which the cover lid will be formed. The plate 600 is solid. The exterior of the plate is formed from a first surface 610 and a second surface (not visible) opposite the first surface. A sidewall 620 joins the first surface and the second surface together. As illustrated here, the plate is a three-dimensional rectangular prism. The first surface and second surface are generally parallel to each other, or put another way the plate has a constant thickness 605. The sidewall 620 has four faces 621, 622, 623, 624. However, it is contemplated that the plate could have any shape. For example, the plate could also be a disk, where the first surface and the second surface are circular, and the sidewall has only one face.

The plate 600 is made from a material. Exemplary materials include beryllium-copper, molybdenum, bronze, glass, an iron-nickel-cobalt alloy (e.g. KOVAR™), an iron-nickel binary alloy (e.g. Alloy 42), or a ceramic selected from the group consisting of alumina ($Al_2O_3$), beryllia (BeO), aluminum nitride (AlN), zirconia toughened alumina (ZTA), SiC, and $Si_3N_4$. The plate has a thickness 605 (measured between the first surface and the second surface) of about 0.5 millimeters (mm) to about 1 millimeter. In particular embodiments, the plate is made from a nonmagnetic material. This may be useful in certain applications where electrical signals/noise can interfere with the electronic component in the package, e.g. in medical imaging applications.

Figure 7:
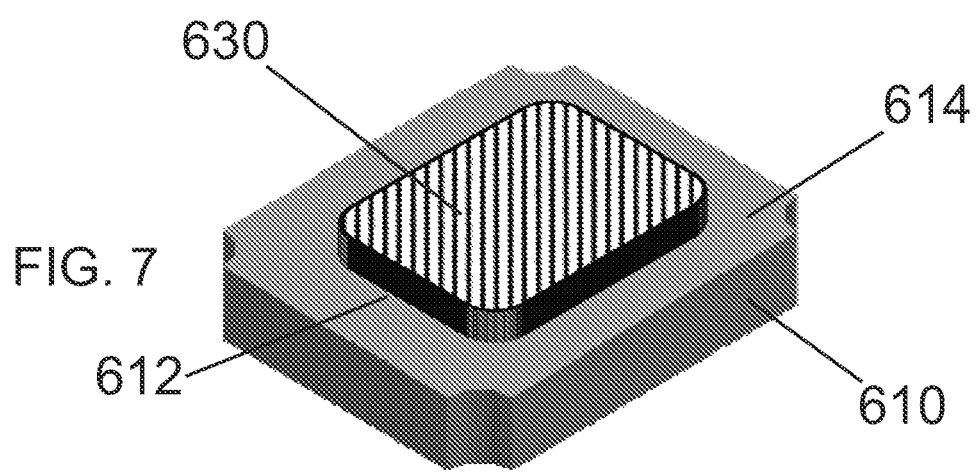
FIG. 7 is a perspective view of a plate with a polyamide mask covering a central area of the plate.

Next, as illustrated in FIG. 7, a polyamide mask 630 is applied to a central area 612 of the first surface of the plate. The first surface is thus divided into a central area 612 covered by the mask, and a peripheral area 614 that is not covered by the mask. The polyamide mask is generally made beforehand with a specified shape and then placed upon the central area of the first surface. It is noted that this is a temperature-sensitive and chemical-sensitive process, so choosing the correct material and composition is crucial.

Figure 8A:
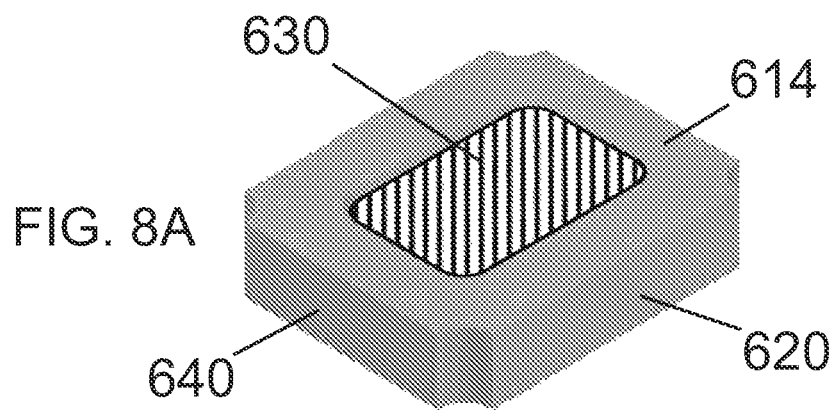
FIG. 8A is a perspective view of a plate after being metallized.

Next, as illustrated in FIG. 8A, the plate is metallized. The metallizing can result in metal being deposited on the polyamide mask as well. The metallization creates a layer of metal on the peripheral area 614 of the first surface, and also a layer of metal on the sidewall 620. The combination of these two layers of metal is referred to herein as a seal ring 640. The metal can be silver, palladium, platinum, nickel, gold, or alloys thereof. In particular embodiments, the seal ring is formed from a non-magnetic metal. The metallizing can be done by sputter deposition, electroplating, thermal spray, chemical vapor deposition (CVD), or any other suitable means.

Another approach is to use a thin film process to create a "seed" layer, then up-plate the seed layer to a thicker metal layer by an electrolytic or electroless process. The seed layer should not contain any organic contents.

In prior continuous manufacturing processes, a single metal mask would be reused on multiple different plates. As a result, metals which were deposited on the metal mask could be carried over between plates, or the metal of the mask itself could be deposited onto subsequent plates. It is contemplated that in the present disclosure, each plate receives its own polyamide mask, and the polyamide mask is not reused between different plates.

In some desirable embodiments, the seal ring can be formed from a set of sublayers. In such embodiments, there may be two sublayers or three sublayers. In specific embodiments, a nickel sublayer can be laid down first, then a gold sublayer can be laid down over the nickel sublayer. The nickel sublayer serves as a barrier to corrosion, while the gold sublayer provides a readily solderable surface. Each sublayer may have a thickness/depth of 0.001 mm to 0.01 mm (i.e. 1 μm to 10 μm). The seal ring may have a thickness/depth of 0.001 mm to 0.04 mm (i.e. 1 μm to 40 μm).

Figure 8B:
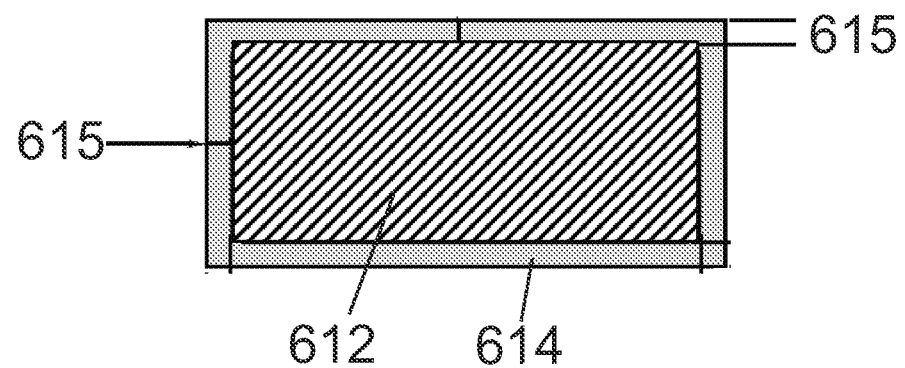
FIG. 8B is a top view of a metallized plate.
Figure 8C:
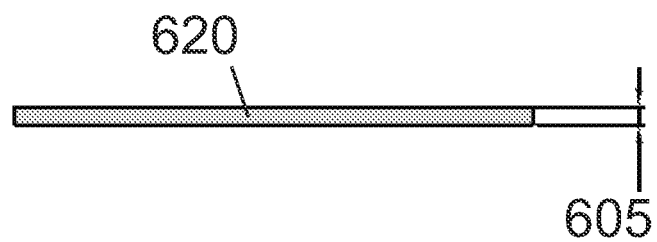
FIG. 8C is a side view of a metallized plate.

FIG. 8B is a plan (top) view of a metallized plate. FIG. 8C is a side view of the metallized plate. Referring to FIG. 8B, the peripheral metallized area is marked with reference numeral 614, and indicated with a clear texture. The central area is marked with reference numeral 612, and indicated with slash lines. The peripheral area is from about 20% to about 35% of the surface area of the first surface of the plate. The central area is from about 65% to about 80% of the surface area of the first surface of the plate. The width of the peripheral area is marked with reference numeral 615, and is from about 0.5 mm to about 1.5 mm. As seen in FIG. 8C, the metal seal ring is also present on the sidewall 620 of the plate. The thickness of the plate is also indicated with reference numeral 605.

Figure 9A:
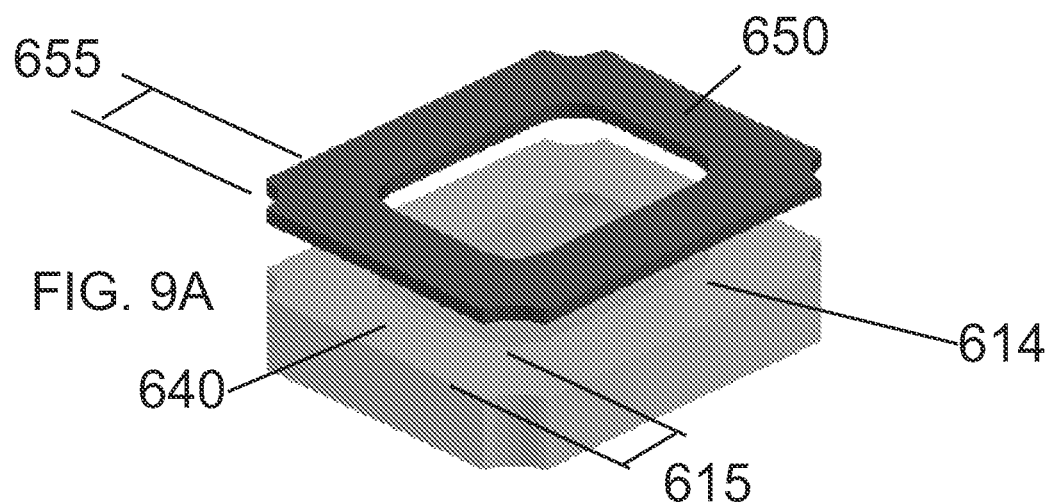
FIG. 9A is an exploded view of a metallized plate with a solder preform.
Figure 9B:
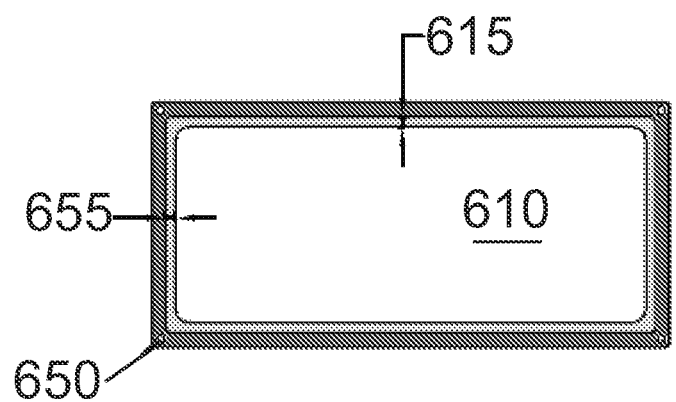
FIG. 9B is a top view of a perspective view of a cover lid in which the seal ring is undesirably offset.

Next, as illustrated in FIG. 9A and FIG. 9B, a solder preform 650 is connected to the seal ring 640. More specifically, the solder preform is laid upon the portion of the seal ring over the peripheral area 614 of the first surface. The solder preform is usually tack welded to the seal ring. FIG. 9A is an exploded view, while FIG. 9B is a plan (top) view of the first surface. In these two figures, the polyamide mask is removed, and the first surface 610 is visible. The solder preform is annular. The width 655 of the solder preform can be equal to or less than the width 615 of the peripheral area. The width of the solder preform is from about 0.3 mm to about 0.6 mm. The solder preform desirably has a melting temperature of from about 200° C. to about 350° C. The solder preform can be made from a gold-tin alloy (e.g. 80Au-20Sn), a lead-based alloy, or a lead-free alloy. The solder volume can be adjusted according to application requirements without needing to modify the metallized area. The solder preform should be very uniform to reduce the risk of excess or insufficient solder joints and voids.

Not illustrated is the removal of the polyamide mask 630 from the central area of the plate. The polyamide mask is removed from the plate after the metallizing that forms the seal ring. However, the polyamide mask could be removed either before or after the connecting of the solder preform, as desired. The central area of the first surface of the final cover lid is thus not metallized; rather the first surface is visible in the central area.

Figure 10:
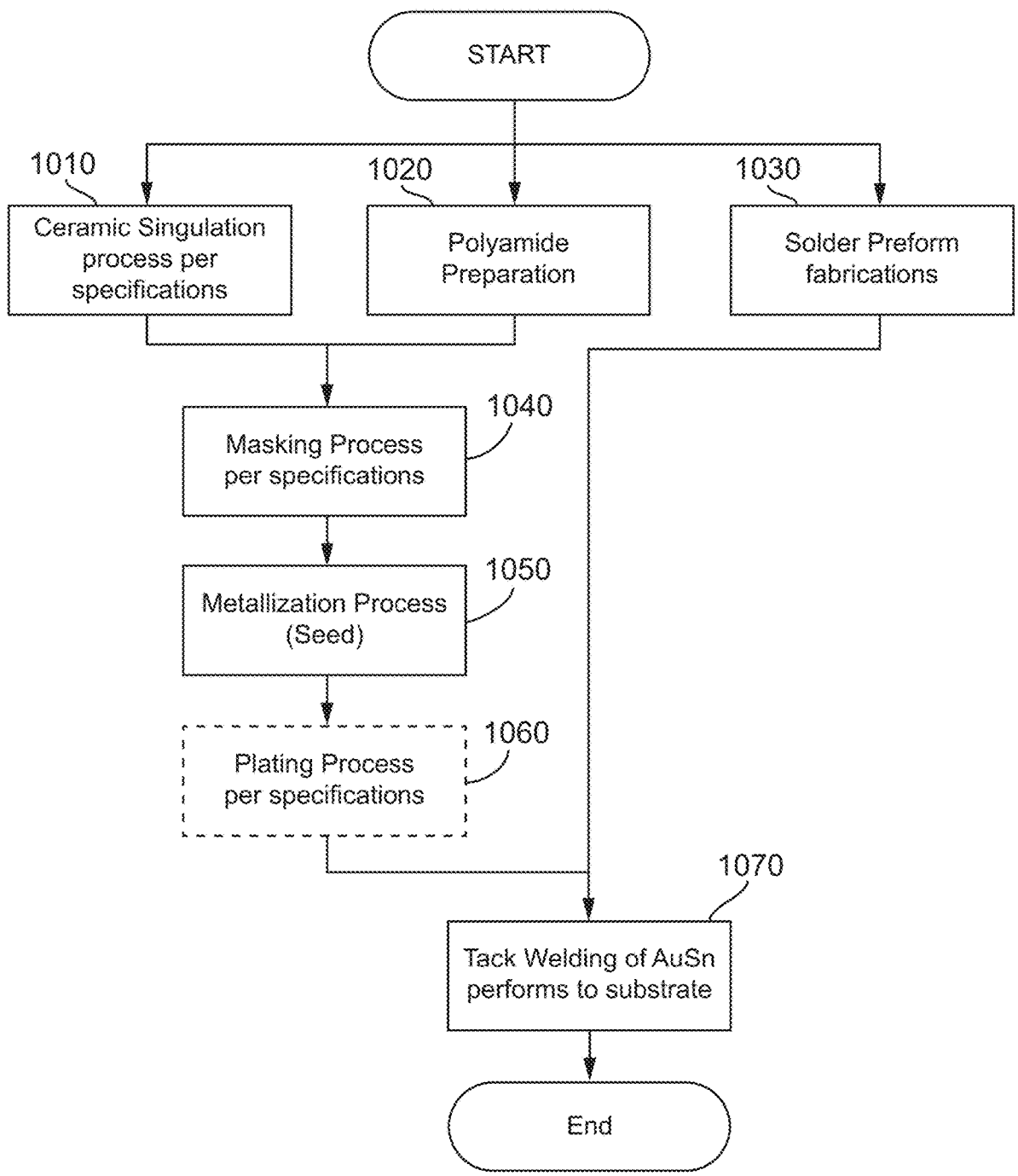
FIG. 10 is a process flowchart of the methods of the present disclosure.

FIG. 10 is a process flowchart that summarizes the steps described above. When the plate of the cover lid is formed from a ceramic, the ceramic plate is singulated from a larger ceramic panel (1010). The polyamide is prepared (1020). The solder preform is also fabricated (1030). The ceramic plate is then masked (1040) using a polyamide mask, and metallized (1050). The optional addition of sublayers upon the first metallized layer is indicated here as plating (1060). Next, the solder preform is tack welded to the substrate to obtain the cover lid (1070).

Many advantages accrue in the presently-described methods. In particular, shrinkage of the seal ring is eliminated. There is a reduction of outgassing during metallization, which prolongs the shelf life of the cover lid, and also improves seal integrity. Any type of solder can be attached to the seal ring. Solder optimization reduces PIND failures as well. The lead time is also improved.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:

1. A method of making a cover lid, comprising:
    applying a mask to a central area of a top surface of a plate and define a peripheral area on the top surface,
    wherein the plate has the top surface, a bottom surface, and a sidewall joining the top surface and bottom surface together, the plate consisting of beryllium-copper, molybdenum, bronze, an iron-nickel-cobalt alloy, an iron-nickel binary alloy, or combinations thereof;
    forming a seal ring by metallizing continuously from the peripheral area of the top surface and extending along an entirety of the sidewall of the plate to an edge with the bottom surface; and
    removing the mask to obtain the cover lid, wherein the central area of the top surface is not metallized.

2. The method of claim 1, wherein the sidewall has a plurality of faces.

3. The method of claim 1, wherein the plate has a thickness of about 0.5 millimeter to about 1 millimeter.

4. The method of claim 1, wherein the plate is in the shape of a disk or a rectangular prism.

5. The method of claim 1, wherein the peripheral area is from about 20% to about 35% of a surface area of the first surface of the plate.

6. The method of claim 1, wherein the seal ring is formed from a metal, wherein the metal includes silver, palladium, platinum, nickel, gold, alloys thereof, or combinations thereof.

7. The method of claim 1, wherein the seal ring is formed from two sublayers or three sublayers.

8. The method of claim 7, wherein a first sublayer of the sublayers is nickel, and a second sublayer of the sublayers is gold, the second sublayer being laid down over the first sublayer.

9. The method of claim 1, wherein the seal ring is formed from a non-magnetic metal.

10. The method of claim 1, wherein the seal ring on the peripheral area has a width of about 0.5 mm to about 1 mm and a thickness of about 1 μm to about 40 μm.

11. The method of claim 1, further comprising tack welding a solder preform to the seal ring on the peripheral area.

12. The method of claim 11, wherein the solder preform does not extend to the sidewall of the plate.

13. The method of claim 11, wherein the solder preform has a melting temperature of from about 200° C. to about 350° C.

14. The method of claim 11, wherein the solder preform is formed from a gold-tin alloy, a lead-based alloy, or a lead-free alloy.

15. The method of claim 1, wherein the mask is polymeric.

16. The method of claim 1, wherein the mask is a polyamide.

* * * * *